(12) United States Patent
Liu (10) Patent No.: US 7,095,263 B2
(45) Date of Patent: Aug. 22, 2006

(54) HYSTERESIS CIRCUIT DEVICE

(75) Inventor: Chih-Min Liu, Taipei (TW)

(73) Assignee: VIA Technologies, Inc., Taipei (TW)

( * ) Notice: Subject to any disclaimer, the term of this patent is extended or adjusted under 35 U.S.C. 154(b) by 9 days.

(21) Appl. No.: 10/944,801

(22) Filed: Sep. 21, 2004

(65) Prior Publication Data
US 2005/0116755 A1    Jun. 2, 2005

(30) Foreign Application Priority Data
Nov. 27, 2003   (TW) .............................. 92133445 A (51) Int. Cl.
*H03K 3/356*    (2006.01)
*H03K 5/22*     (2006.01)
*H03K 17/693*   (2006.01)

(52) U.S. Cl. .................... 327/205; 327/77; 327/407

(58) Field of Classification Search ............... 327/205, 327/206, 415
See application file for complete search history.

(56) References Cited

U.S. PATENT DOCUMENTS 6,348,833 B1    2/2002   Tsujimoto et al.
6,597,224 B1 *  7/2003   Lin et al. .................... 327/205
6,906,568 B1 *  6/2005   Lin et al. .................... 327/205
6,940,329 B1 *  9/2005   Tsai et al. ................... 327/205

* cited by examiner

*Primary Examiner*—Long Nguyen
*Assistant Examiner*—Ryan Jager
(74) *Attorney, Agent, or Firm*—Birch, Stewart, Kolasch & Birch, LLP (57) ABSTRACT

The present invention provides one hysteresis circuit device. The hysteresis circuit device includes an input voltage level generator, a switch, and a comparator. The input voltage level generator is used to receive an input signal and output a high input voltage and a low threshold voltage. The switch is used to receive the high input voltage and the low threshold voltage, and output a switch output signal according to a digital signal. The comparator has one terminal used to receive the switch output signal, and another terminal used to receive a reference signal. Then, the comparator outputs the digital signal. The hysteresis circuit device can change their voltage levels by an external circuit; therefore, the noise resulting from the input signal can be avoided and the problem of false detection of the comparator can be solved.

19 Claims, 8 Drawing Sheets

HYSTERESIS CIRCUIT DEVICE

This Non-provisional application claims priority under 35 U.S.C. § 119(a) on Patent Application No(s). 092133445 filed in Taiwan, Republic of China on Nov. 27, 2003, the entire contents of which are hereby incorporated by reference.

BACKGROUND OF THE INVENTION

1. Field of the Invention

The present invention relates generally to a hysteresis circuit device, and more particularly to a hysteresis circuit device with modulated hysteresis voltage levels for reducing the manufacturing cost.

2. Description of the Prior Art

Figure 1:
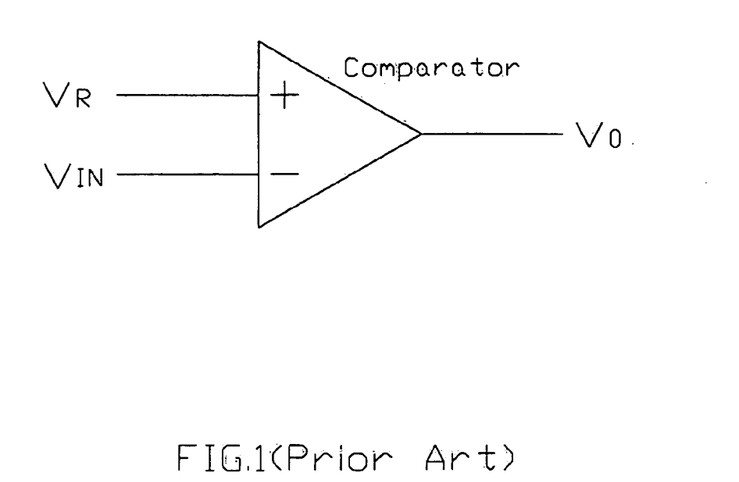
FIG. 1 shows the conventional comparator.

Referring to FIG. 1, it is a comparator with two inputs (an input voltage $V_{IN}$ and a reference voltage $V_R$) and one output $V_O$. When the input voltage $V_{IN}$ is higher than the reference voltage $V_R$, the output voltage $V_R$ is at the voltage high level; otherwise, it is at the voltage low level.

Figure 2:
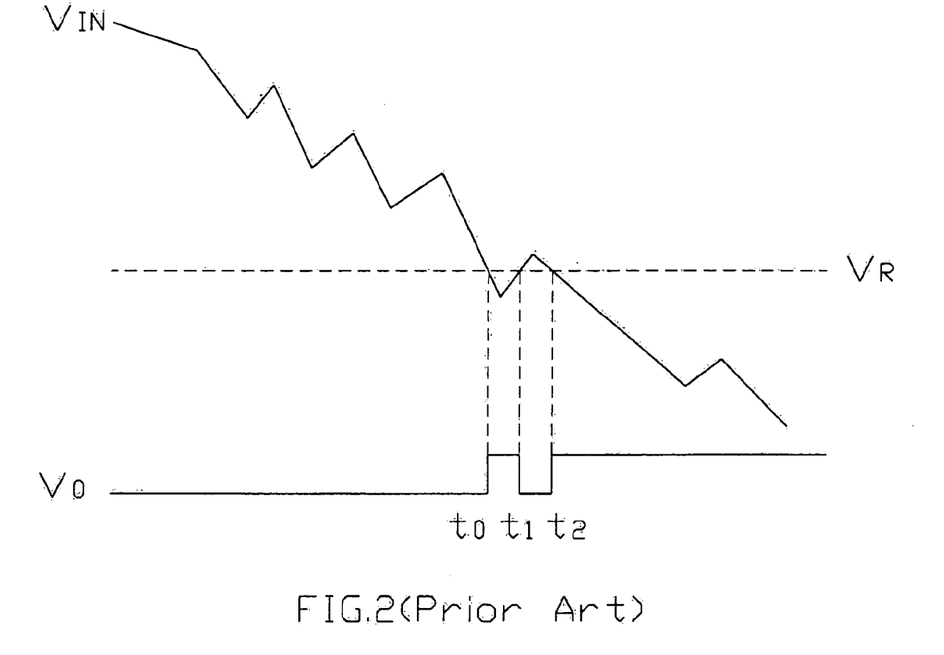
FIG. 2 shows the relationships of the input voltage $V_{IN}$, the reference voltage $V_R$, and the output voltage $V_O$ of the comparator in FIG. 1.

Referring to FIG. 2, it illustrates the relationships of the input voltage $V_{IN}$, the reference voltage $V_R$, and the output voltage $V_O$ of the comparator as shown in FIG. 1. Herein, the reference voltage $V_R$ is coupled to a direct voltage source and the input voltage $V_{IN}$ is coupled to an input voltage source with noises. Before time $t_0$, because the input voltage $V_{IN}$ is higher than the reference voltage $V_R$, the output voltage $V_O$ is '0'. Between time $t_0$ and $t_1$, the input voltage $V_{IN}$ is lower than the reference voltage $V_R$, so the output voltage $V_O$ is '1'. Between time $t_1$ and $t_2$, the input voltage $V_{IN}$ is higher than the reference voltage $V_R$ due to the effect of noise, so the output voltage $V_O$ is '0'. The change of the voltage values in the above situation results in the false detection of the output voltage $V_O$ because of the noises. After time $t_2$, the input voltage $V_{IN}$ is lower than the reference voltage $V_R$, so the output voltage $V_O$ is '1'.

Figure 3:
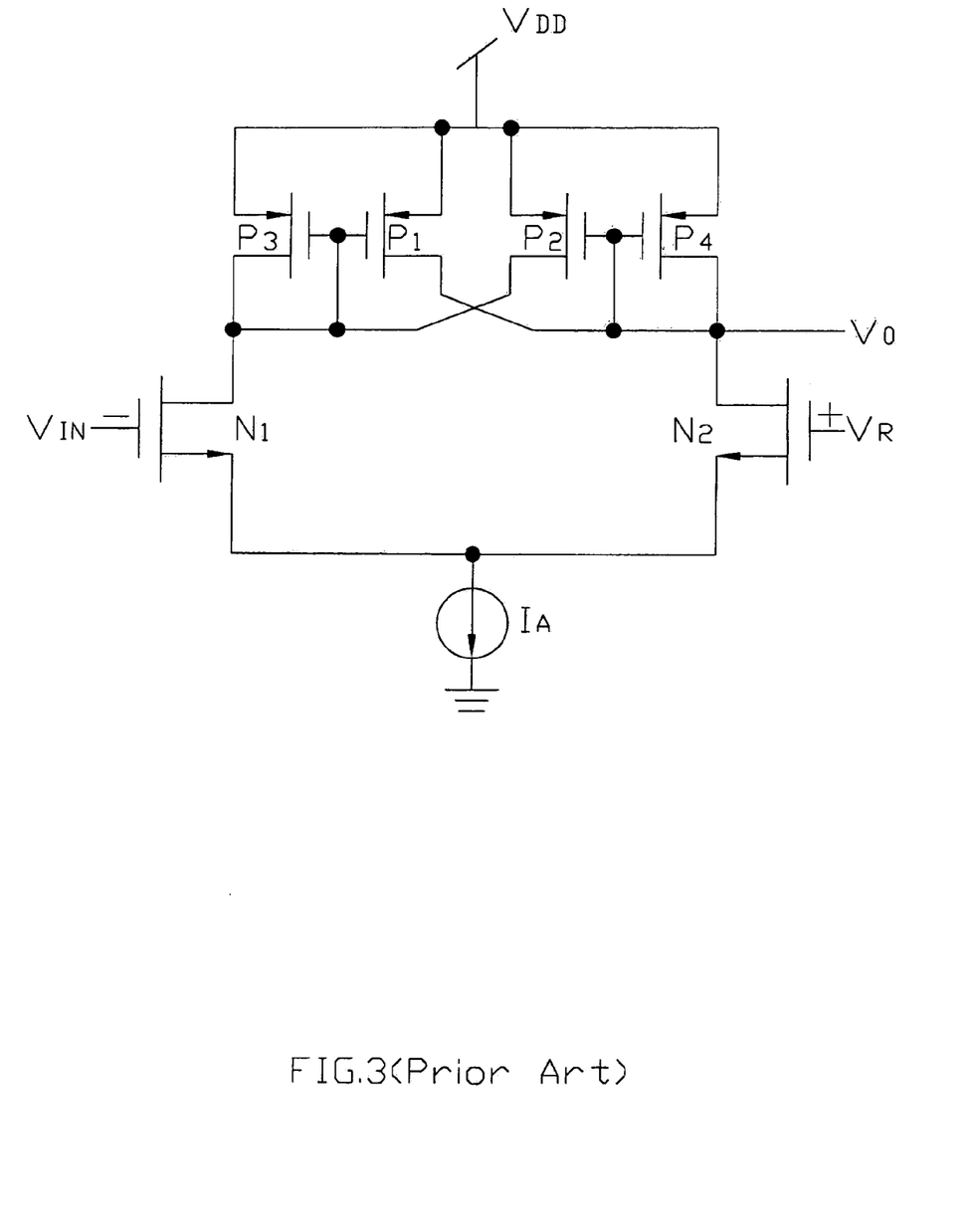
FIG. 3 schematically illustrates the circuit diagram of the conventional comparing device.

The conventional way to resolve the false detection of the output due to the noise is to employ the interior circuit of a comparator and positive feedback mechanism to produce hysteresis to achieve anti-noise. Referring to FIG. 3, it illustrates the conventional hysteresis comparing circuit apparatus, including four PMOS transistors, two NMOS transistors, and a constant direct current source $I_A$. All of the source regions of the PMOS transistors P1, P2, P3, and P4 are commonly coupled to the system voltage source $V_{DD}$. The gate electrode of the transistor P1, the gate electrode and drain region of the transistor P3, the drain region of the transistor P2, and the drain region of the transistor N1 are commonly electrically coupled together. The gate electrode of the transistor P2, the gate electrode and the drain region of the transistor P4, the drain region of the transistor P1, and the drain region of the transistor N2 are electrically coupled together. The source regions of the transistors N1 and N2 are commonly coupled to the input terminal of the constant current source $I_A$. The output terminal of the constant current source $I_A$ is coupled to the ground. The gate electrode of the transistor N2 is coupled to the positive input terminal $V_R$ of the comparator and the gate electrode of the transistor N1 is coupled to the negative input terminal $V_{IN}$ of the comparator. If the size of the transistor P1 is larger than that of the transistor P3 and the size of the transistor P2 is larger than that of the transistor P4, this hysteresis comparing circuit has the hysteresis effect. Because this phenomenon is well known to those who are familiar with this technical field, it will not be described in detail here. However, because the mobility, the input voltage and the thickness of the gate oxide layer of the MOS transistors are easily affected with the change of the fabrication process or the temperature, the hysteresis width (the difference between the high input voltage and the low threshold voltage) of the hysteresis comparing circuit apparatus is not easily to control and modulate according to the need of a user.

Based on the weaknesses of the above conventional technology, another conventional hysteresis circuit device employing the exterior circuit of a comparator to control a constant hysteresis width is provided. As referred to FIG. 4, it shows a conventional hysteresis circuit device 100, including a threshold voltage generator 110, a switch 120, and a comparator 130. The hysteresis circuit device 100 is used to detect an input signal $V_{IN}$ and a reference signal $V_R$, and output a digital signal $V_O$. Herein, the threshold voltage generator 110 is used to receive the reference voltage $V_R$, and output a high threshold voltage $V_{RH}$ and a low threshold voltage $V_{RL}$. The input of the switch 120 is coupled to the high threshold voltage $V_{RH}$ and a low threshold voltage $V_{RL}$ of threshold voltage generator 110, and the digital signal $V_O$ is received to choose the high threshold voltage $V_{RH}$ or the low threshold voltage $V_{RL}$ as the output $V_T$ of the switch 120. When the digital signal $V_O$ is at the low voltage level, the switch output signal $V_T$ is the low threshold voltage $V_{RL}$. When the digital signal $V_O$ is at the high voltage level, the switch output signal $V_T$ then is the high threshold voltage $V_{RH}$. The comparator 130 is coupled to the switch 120. The positive input terminal of the comparator 130 is used to receive the output signal $V_T$ of the switch 120 and the negative input terminal of the comparator 130 is used to receive the input signal $V_{IN}$. According to the output signal $V_T$ of the switch 120 and the input signal $V_{IN}$, the comparator 130 outputs the digital signal $V_O$.

Figure 5:
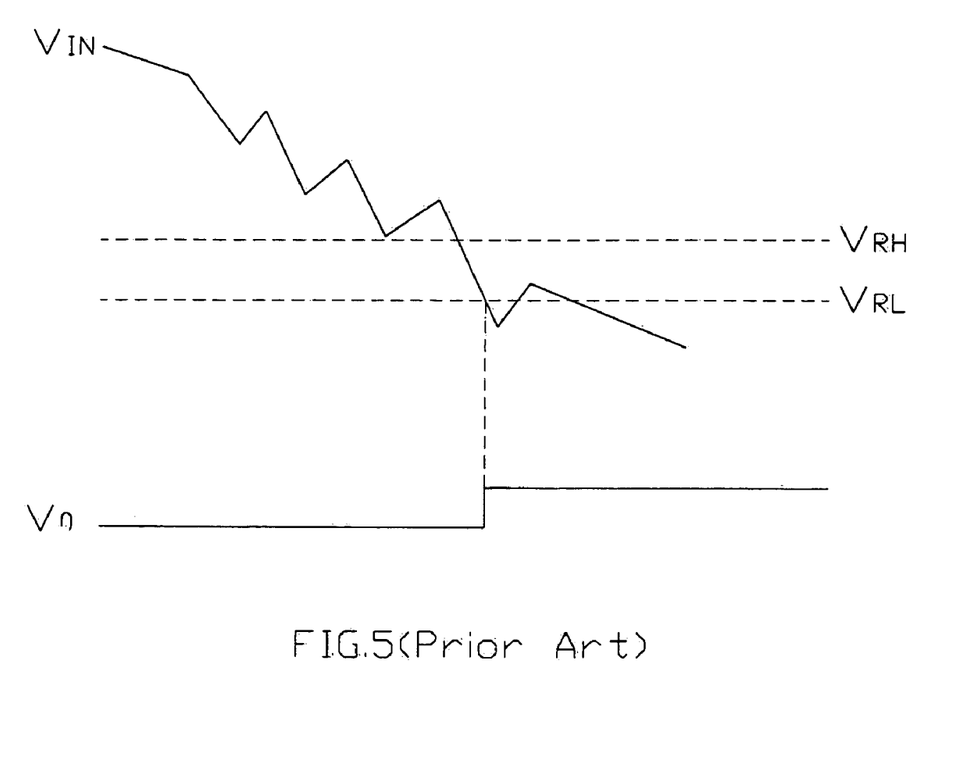
FIG. 5 shows the relationships of the input voltage $V_{IN}$, the high input voltage $V_{RH}$, the low input voltage $V_{RL}$, and the output voltage $V_O$ of the hysteresis circuit device 100 in FIG. 4.

Referring to FIG. 5, when the digital signal $V_O$ is at the low voltage level, the output signal $V_T$ of the switch 120 is the low threshold voltage $V_{RL}$. Then, the comparator 130 compares the output signal $V_T$ of the switch 120 and input signal $V_{IN}$. When the input signal $V_{IN}$ is higher than the low threshold voltage $V_{RL}$, the digital signal $V_O$ of the comparator 130 is still at the low voltage level. When the input signal $V_{IN}$ is lower than the low threshold voltage $V_{RL}$, the digital signal $V_O$ is switched from the low voltage level to the high voltage level. In the meantime, if the input signal $V_{IN}$ inputs carries noises and the noises are lower than the hysteresis width ($V_{RH}$–$V_{RL}$), the output result is not affected. Thereafter, because the digital signal $V_O$ is switched from the low voltage level to the high voltage level, the switch output signal $V_T$ is switched to the high threshold voltage $V_{RH}$. At this moment, the input signal $V_{IN}$ is far less than the high threshold voltage $V_{RH}$. Therefore, the digital signal $V_O$ is still at the high voltage level. Because the switch 120 chooses either the high threshold voltage $V_{RH}$ or the low threshold voltage $V_{RL}$ opportunely, and changes the judging voltage level of the comparator 130 opportunely, the input signal $V_{IN}$ can avoid the interference of the noises.

Figure 4:
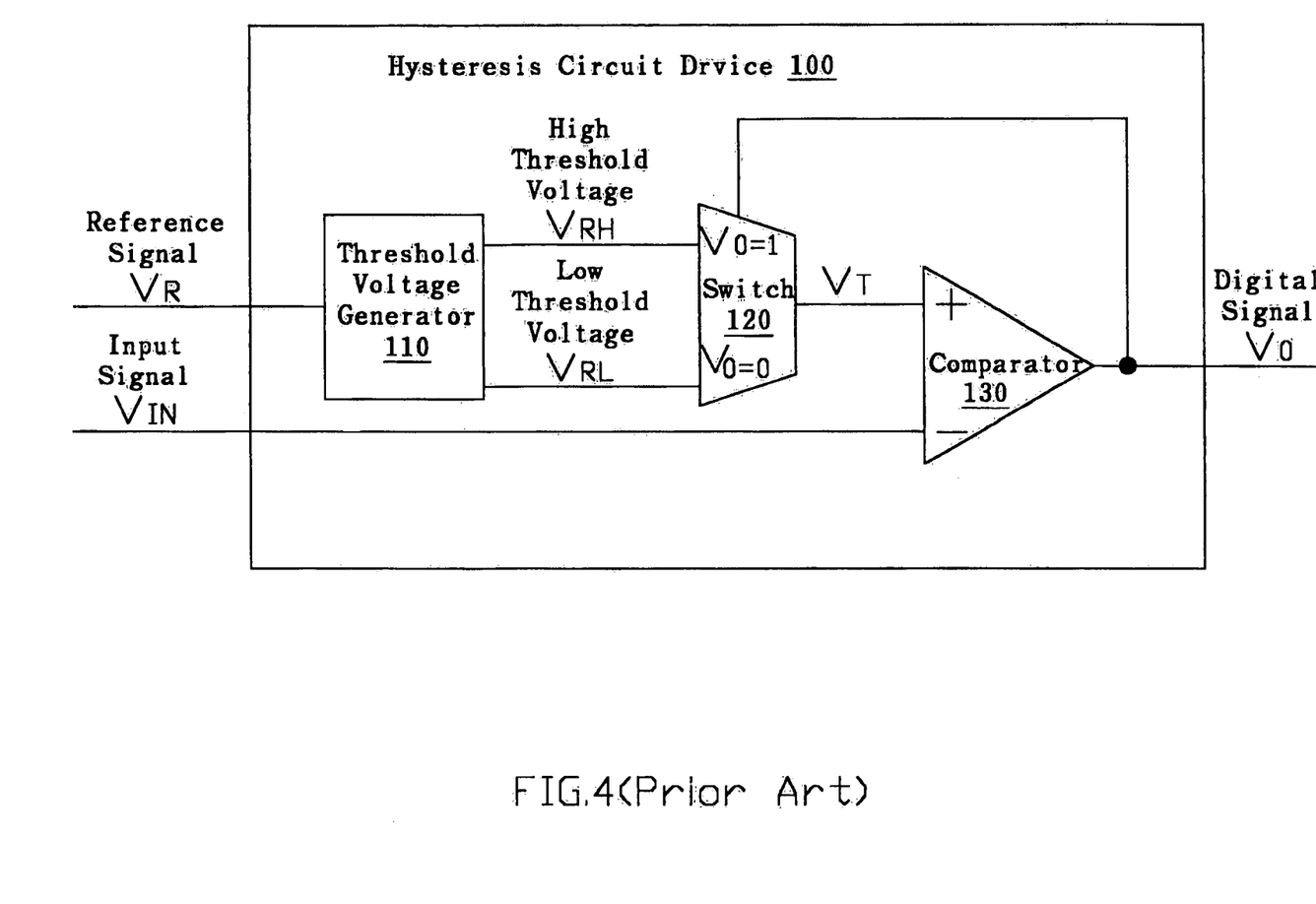
FIG. 4 schematically shows the circuit structure of the conventional hysteresis circuit device 100.
Figure 6:
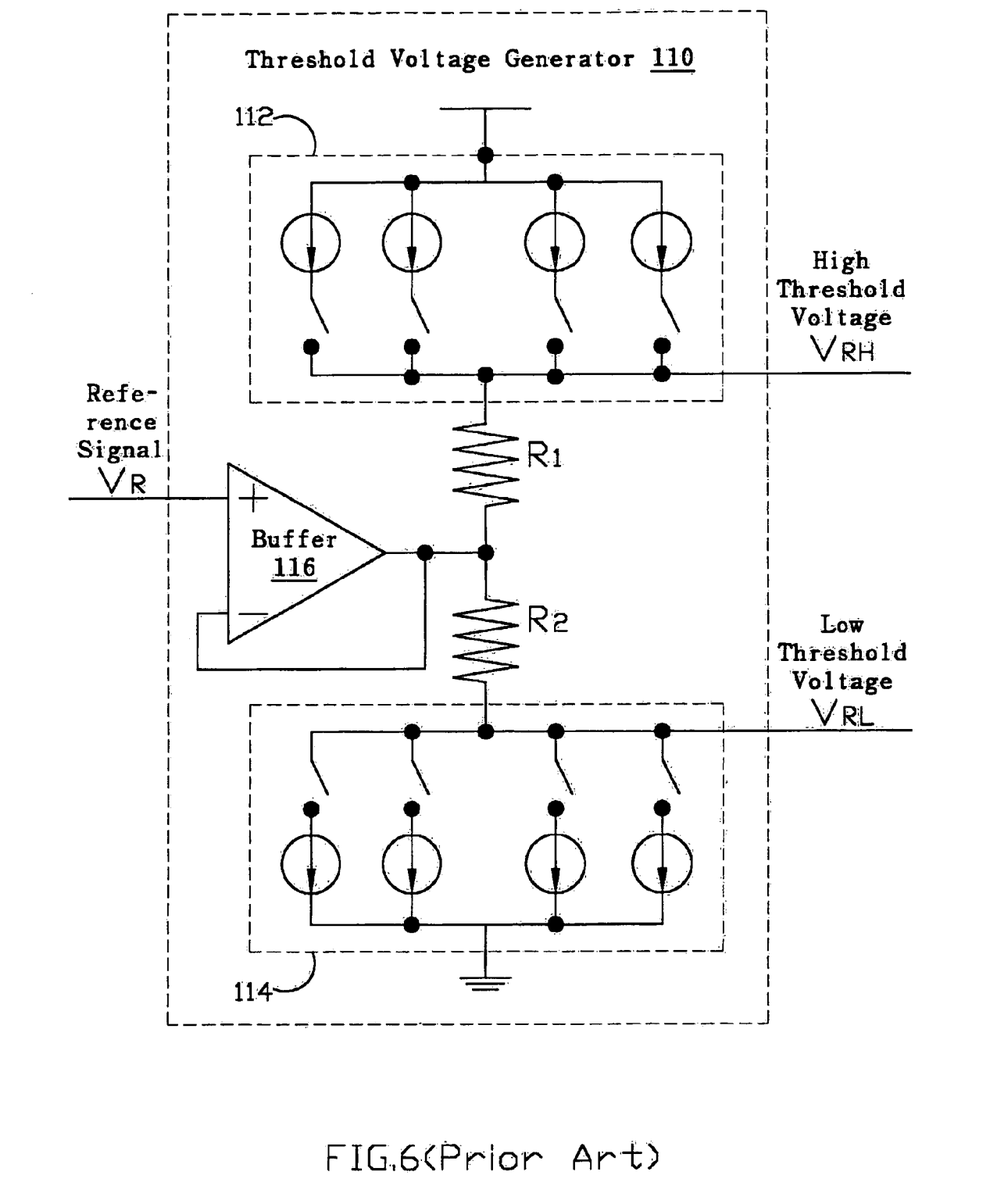
FIG. 6 schematically shows the circuit structure of the input voltage level generator 110 in FIG. 4.

Referring to FIG. 6, it schematically shows the circuit structure of the threshold voltage generator 110 in FIG. 4, including an input voltage, i.e. the reference voltage $V_R$, two output voltages, and i.e. the high threshold voltage $V_{RH}$ and the low threshold voltage $V_{RL}$. The threshold voltage generator 110 also includes two current source groups in parallel (the first current source group 112 and the second current source group 114), a buffer 116, and two resistors (R1 and R2). Herein, one terminal of the resistor R1 is coupled to the first current source group 112, and is one of the outputs of the input voltage level generator 110, i.e. the high threshold voltage $V_{RH}$. The buffer 116 receives the reference voltage $V_R$. The output of buffer 116 is coupled to another terminal of the resistor R1 and one terminal of the resistor R2. Another terminal of the resistor R2, coupled to one terminal of the second current source group 114, is another output of the input voltage level generator 110, i.e. the low threshold voltage $V_{RL}$. Another terminal of the second current source group 114 is coupled to the ground.

The prior art of the circuit design of the threshold voltage generator 110 as mentioned above can make the hysteresis width a constant without being affected by the exterior environment, and avoid outputting the false detection because of the noises. However, it includes a buffer and many current sources in this design. They occupy larger chip area and dissipate more extra operation power. Hence, the production cost is also increased.

SUMMARY OF THE INVENTION

According to the withdraws of the conventional hysteresis circuit device in the above invention background, the present invention provides a hysteresis circuit device whose characters is to eliminate the interference of noises, size down the area, and save the operating power consumption. Accordingly, the object of the present invention is to employ a hysteresis circuit device to produce modulated hysteresis voltage levels. Therefore, the high input voltage and the low input voltage can be adjusted in accordance with the magnitudes of the noises to eliminate the interference of the noises, and resolve the problem of the false detection of comparators in a noisy environment. Furthermore, the present invention can size down the chip area enormously, and save the extra operating power to decrease the manufacturing cost.

One preferred embodiment of the present invention provides a hysteresis circuit device, including an input voltage level generator to receive an input signal and output a high input voltage and a low input voltage. Herein, the input voltage level generator includes a first current source and a second current source to generate different voltage values for the high input voltage and the low input voltage. Besides, there exists a plurality of parallel resistors between the first current source and the second current source. In addition, the input voltage level generator includes a first multiplexer and a second multiplexer. The plurality of inputs of the first and the second multiplexers are separately coupled to the two terminals of the plurality of resistors in order to provide the inputs of the different high and low input voltage by a first programming selection control line and a second programming selection control line. Secondly, the hysteresis circuit device also includes a switch coupled to the input voltage level generator to receive the high input voltage and the low input voltage, and decide the switch output signal according to the digital signal. And the hysteresis circuit device includes a comparator to receive the switch output signal and the reference signal, and output the digital signal.

BRIEF DESCRIPTION OF THE DRAWINGS

The foregoing aspects and many of the attendant advantages of this invention will become more readily appreciated and be better understood by reference to the following detailed description, when taken in conjunction with the accompanying drawings, wherein.

DESCRIPTION OF THE PREFERRED EMBODIMENT

Figure 7:
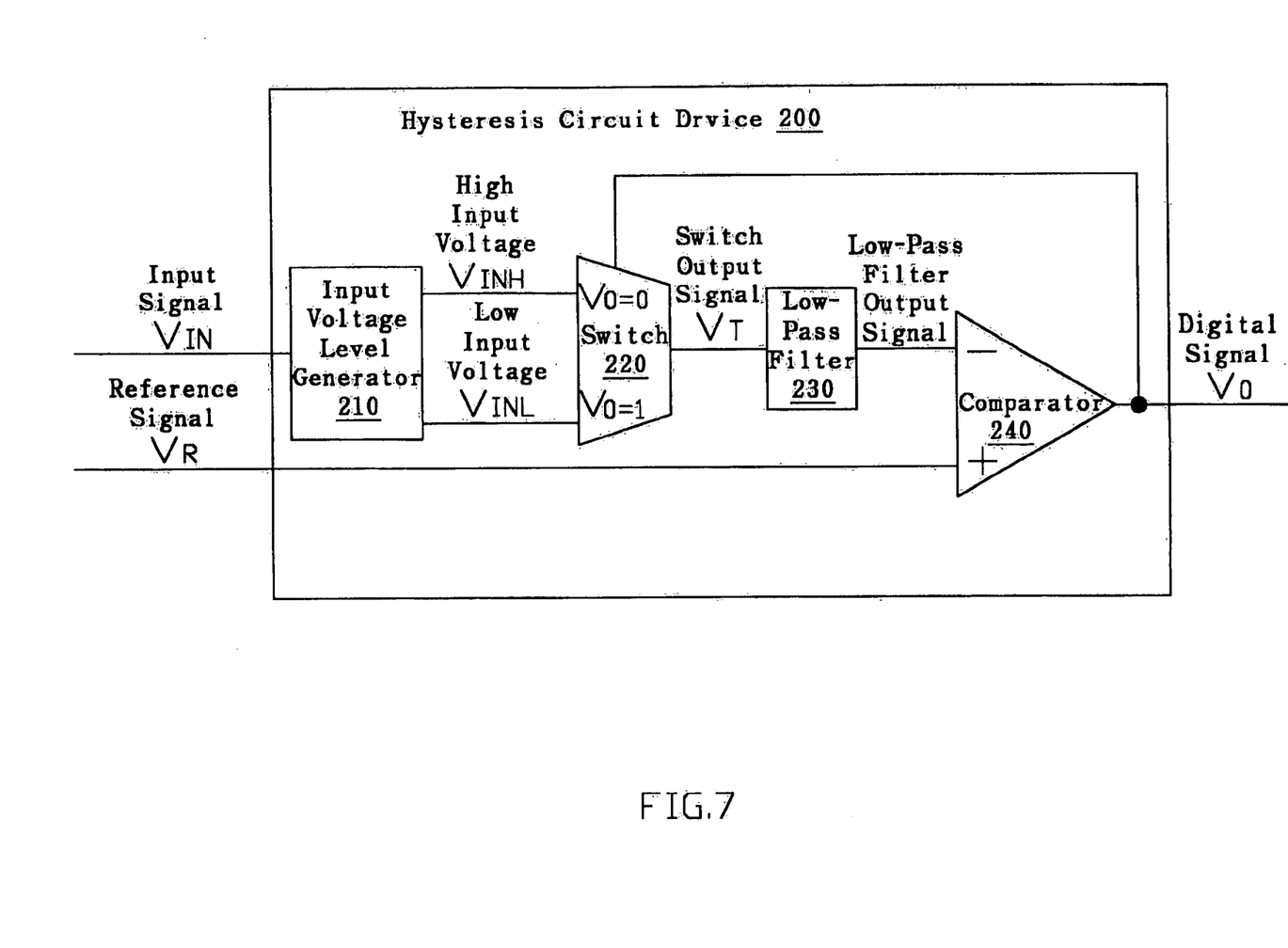
FIG. 7 schematically shows the circuit structure of the hysteresis circuit device 200 in current invention.

The above has summarized the present invention. The following will have a further description of the present invention in detail. The conventional technologies adopted by the present invention are only recited in some objects with emphasis to explicate the present invention. The specification and the accompanying drawings of the present invention in the following are not limited by the embodiments. Nevertheless, it should be recognized that the present invention can be practiced in a wide range of other embodiments besides those explicitly described, and the scope of the present invention is expressly not limited except as specified in the accompanying claims. Referring to FIG. 7, it schematically shows the circuit structure of the hysteresis circuit device 200 according to one preferred embodiment of the present invention. Before describing the detailed structure of the drawing, we have to emphasize that the drawing provided by the present invention is not to limit the scope and spirit of the present invention. In FIG. 7, the hysteresis circuit device 200 includes a input voltage level generator 210, a switch 220, a low-pass filter 230, and a comparator 240. The hysteresis circuit device 200 receives an input signal $V_{IN}$ and a reference signal $V_R$, and outputs a digital voltage $V_O$. The input voltage level generator 210 receives the input signal $V_{IN}$ and outputs a high input voltage $V_{INH}$ and a low input voltage $V_{INL}$. The switch 220 coupled to the input voltage level generator 210, receives a feedback digital signal $V_O$ configured to select the high input voltage $V_{INH}$ or the low input voltage $V_{INL}$ as a switch output signal $V_T$. When the digital signal $V_O$ is at the low voltage level, the high input voltage $V_{INH}$ is employed as the switch output signal $V_T$. When the digital signal $V_O$ is at the high voltage level, the threshold voltage $V_{INL}$ is employed as the switch output signal $V_T$. The input terminal of the low-pass filter 230 is coupled to the switch output signal $V_T$, and the output terminal of the low-pass filter 230 is coupled to one input terminal of the comparator 240. The reference signal $V_R$ is coupled to another input terminal of the comparator 240. The comparator 240 outputs the digital signal $V_O$ according to the reference signal $V_R$ and the low-pass filter output signal. It is noted that the result is also achieved with the exemplary circuit structure exclusive of the low-pass filter 230.

Figure 8:
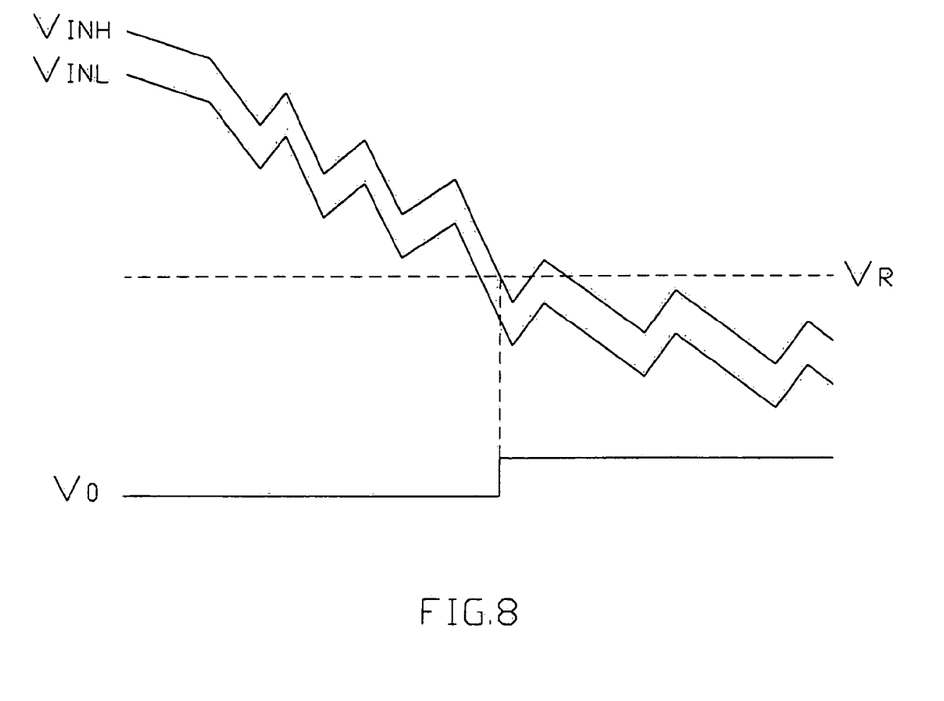
FIG. 8 shows the relationships of the high input voltage $V_{INH}$, the low input voltage $V_{INL}$, the reference signal $V_R$ and the output voltage $V_O$ of the hysteresis circuit device 200 in FIG. 7.

Referring to FIG. 8, when the digital signal $V_O$ is at the low voltage level, the high input voltage $V_{INH}$ is employed as the switch output signal $V_T$. The high input voltage $V_{INH}$ passes the low-pass filter 230 to eliminate the charge injecting effect of the switch 220, and then is coupled to one input terminal of the comparator 240. And further, the comparator 240 compares the high input voltage $V_{INH}$ with the reference signal $V_R$. When the high input voltage $V_{INH}$ is higher than the reference signal $V_R$, the digital signal $V_O$ is still at the low voltage level. When the high input voltage $V_{INH}$ is lower than the reference signal $V_R$, the digital signal $V_O$ is switched from the low voltage level to the high voltage level. At the same time, the switch 220 switches to output the low input voltage $V_{INL}$. If the low input voltage $V_{INL}$ carries noises and if the noises are lower than the hysteresis width ($V_{INH}$–$V_{INL}$), then the low input voltage $V_{INL}$ is lower than the reference signal $V_R$, and then the output will not be changed. Therefore, the hysteresis circuit device 200 in the present invention can eliminate the affect of the noises effectively.

Figure 9:
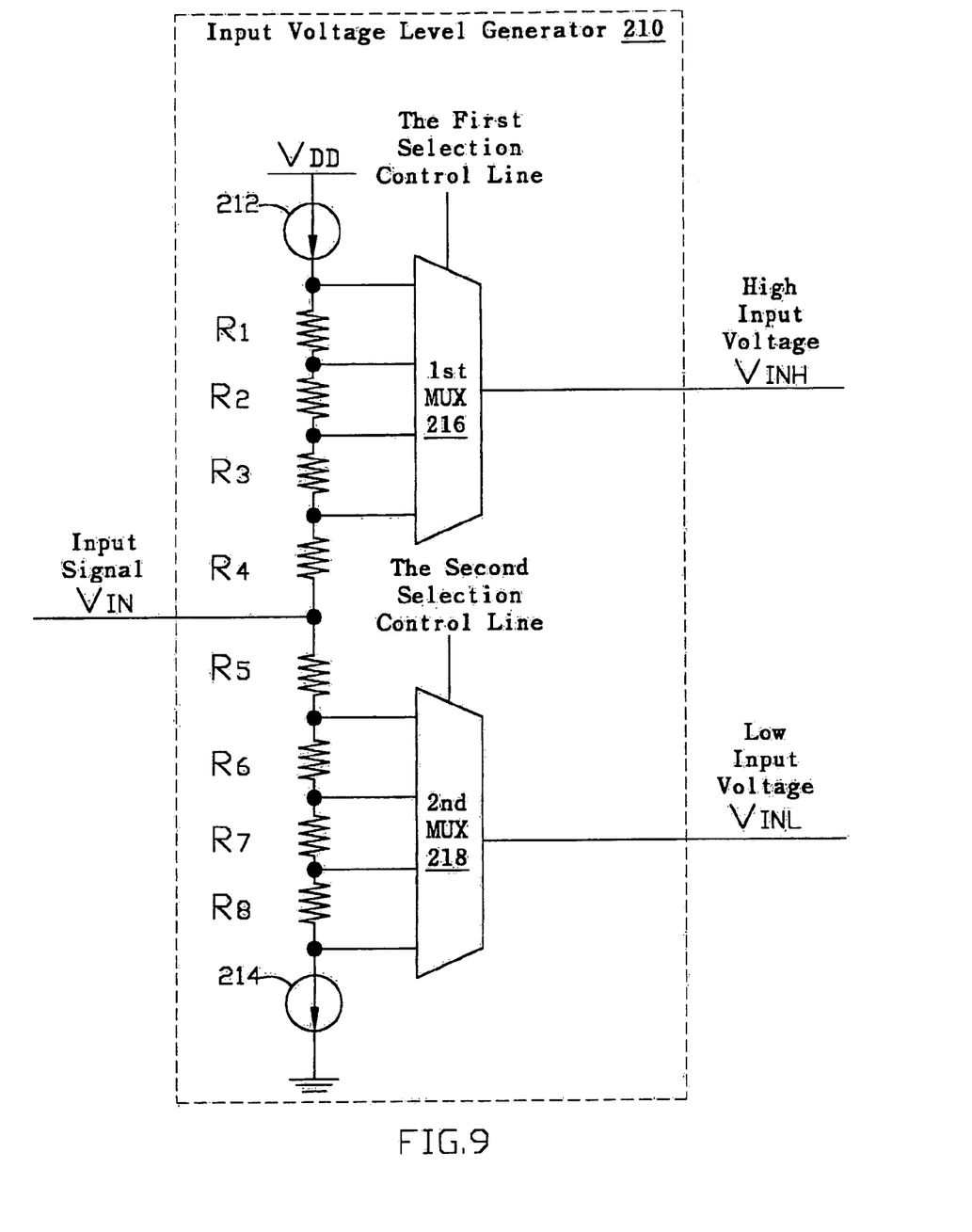
FIG. 9 schematically shows the circuit structure of the input voltage level generator 210 in FIG. 7.

Referring to FIG. 9, it schematically shows the circuit structure of the input voltage level generator 210, including an input voltage, which is the input signal $V_{IN}$, and two output voltages, which are the high input voltage $V_{INH}$ and the low input voltage $V_{INL}$. The input voltage level generator 210 includes two current sources (the first current source 212 and the second current source 214) and two multiplexers (the first multiplexer 216 and the second multiplexer 218). Besides, there exist eight resistors R1–R8, which are in serial connection between the first current source 212 and the second current source 214. A terminal of the first current source 212 is coupled to the system supply voltage $V_{DD}$ and another terminal of the first current source 212 is coupled to resistors R1–R4. The resistors R1–R4, serially connected to form a branch current circuit, are connected to the first multiplexer 216 respectively to act as the inputs with different voltage values, and to be controlled by a first programmable selection control line to choose one of the four input voltage values as the output of the first multiplexer 216. And the output is the high input voltage $V_{INH}$. Besides, the input signal $V_{IN}$ is coupled to respective one terminal of the resistor R4 and R5. The resistors R5–R8 are serially connected. Another terminal of the resistor R8 is connected to a terminal of the second current source 214, and another terminal of the second current source 214 is connected to the ground. R5–R8 also form a branch current circuit and are connected to the second multiplexer 218 respectively to act as four inputs with different voltage values of the second multiplexer 218, and to be controlled by a second programmable selection control line to choose one of the four input voltage values as the output of the second multiplexer 218. And the output is the low input voltage $V_{INL}$. Accordingly, the hysteresis circuit device of the present invention provides various high and low threshold voltages for selection. Therefore, the hysteresis width can be modulated according to the selection of different high and low threshold voltages.

It is noted that the difference between the FIG. 6 and the present invention is that the input voltage level generator 210 receives the input signal $V_{IN}$ while the input voltage level generator 110 receives the reference signal $V_R$ in FIG. 6. In the present invention, the hysteresis width can be modulated according to selection of different high threshold voltages and low threshold voltages. Besides, the design of the input voltage level generator 210 in the present invention uses fewer current sources and no buffers. Therefore, the chip area and power consumption are reduced vastly to decrease the manufacturing cost.

The described above is only the embodiments of the present invention. It is not used to limit the scope of the claim of the present invention. It will be obvious to those skilled in the art that various modifications may be made without departing from what is intended to be limited solely by the appended claims.

What is claimed is:

1. A hysteresis circuit device, comprising:
    an input voltage level generator, said input voltage level generator comprises:
    a first current source, wherein a terminal of said first current source is coupled to a system voltage source;
    a second current source, wherein a terminal of said second current source is coupled to a ground;
    a plurality of serial resistors coupled to an input signal and divided by said input signal into a first serial resistors part and a second serial resistors part, wherein a terminal of said plurality of serial resistors is coupled to another terminal of said first current source, and another terminal of said plurality of serial resistors is coupled to another terminal of said second current source;
    a first multiplexer including a terminal coupled to said first serial resistors part, and controlled by a first selection control line to select an output voltage of said first serial resistors part to be an output of said first multiplexer;
    a second multiplexer including a terminal coupled to said second serial resistors part, and controlled by a second selection control line to select an output voltage of said second serial resistors part to be an output of said second multiplexer;
    a switch receiving said outputs of said first and second multiplexers and outputting a switch output signal according to a digital signal; and
    a comparator including a first input terminal to receive said switch output signal, a second input terminal coupled to a reference signal, and an output terminal to output said digital signal.

2. The hysteresis circuit device according to claim 1, wherein said plurality of serial resistors have the same resistance.

3. The hysteresis circuit device according to claim 1, wherein said first selection control line a programmable signal.

4. The hysteresis circuit device according to claim 1, wherein said second selection control line transmits a programmable signal.

5. The hysteresis circuit device according to claim 1, wherein said output of said first multiplexer is a high threshold voltage.

6. The hysteresis circuit device according to claim 1, wherein said output of said second multiplexer is a low threshold voltage.

7. The hysteresis circuit device according to claim 1, wherein said reference signal includes a direct current signal.

8. The hysteresis circuit device according to claim 1, wherein said switch outputs a low input voltage signal when said digital signal is at a high voltage level.

9. The hysteris circuit device according to claim 1, wherein said switch outputs a high input voltage signal when said digital signal is at a low voltage level.

10. The hysteresis circuit device according to claim 1, further comprising a low-pass filter connected between said switch and said comparator to eliminate the charge injection effect of said switch.

11. A hysteresis circuit device, comprising:
    a first current source, wherein a terminal of said first current source is coupled to a system voltage source;

a second current source, wherein a terminal of said second current source is coupled to a ground;

a plurality of serial resistors coupled to said input signal and divided by said input signal into a first serial resistors part and a second serial resistor part, wherein a terminal of said plurality of serial resistors is coupled to another terminal of said first current source, and another terminal of said plurality of serial resistors is coupled to another terminal of said second current source;

a first multiplexer including a terminal coupled to said first serial resistors part, and controlled by a first selection control line to select an output voltage of said first serial resistors part to be an output of said first multiplexer;

a second multiplexer including a terminal coupled to said second serial resistors part, and controlled by a second selection control line to select an output voltage of said second serial resistors part to be an output of said second multiplexer;

a switch receiving said outputs of said first and second multiplexers, and having a output terminal outputting a switch output signal according to a digital signal;

a low-pass filter including a terminal coupled to said output terminal of said switch to receive said switch output signal, and producing a low-pass filter output signal outputted from another terminal of said low-pass filter; and a comparator including a first input terminal coupled to said another terminal of said low-pass filter to receive said low-pass filter output signal, a second input terminal coupled to a reference signal, and an output terminal to output said digital signal, wherein said digital signal is feedback to said switch.

12. The hysteresis circuit device according to claim 11, wherein said reference signal includes a direct current signal.

13. The hysteresis circuit device according to claim 11, wherein said switch outputs a low input voltage signal when said digital signal is at a high voltage level.

14. The hysteresis circuit device according to claim 11, wherein said switch outputs a high input voltage signal when said digital signal is at a low voltage level.

15. The hysteresis circuit device according to claim 11, wherein said plurality of serial resistors have the same resistance.

16. The hysteresis circuit device according to claim 11, wherein said first selection control line transmits a programmable signal.

17. The hysteresis circuit device according to claim 11, wherein said second selection control line transmits a programmable signal.

18. The hysteresis circuit device according to claim 11, wherein said output of said first multiplexer includes a high threshold voltage.

19. The hysteresis circuit device according to claim 11, wherein said output of said second multiplexer includes a low threshold voltage.

* * * * *